United States Patent [19]

Nishihara

[11] Patent Number: 5,424,566

[45] Date of Patent: Jun. 13, 1995

[54] DRAM CELL CAPACITOR

[75] Inventor: Toshiyuki Nishihara, Kanagawa, Japan

[73] Assignee: Sony Corporation, Tokyo, Japan

[21] Appl. No.: 180,458

[22] Filed: Jan. 12, 1994

Related U.S. Application Data

[63] Continuation of Ser. No. 880,553, May 8, 1992, abandoned.

[30] Foreign Application Priority Data

May 10, 1991 [JP] Japan .................. 3-105603

[51] Int. Cl.$^6$ .................. H01L 29/68; H01L 29/78; H01L 29/92
[52] U.S. Cl. .................. 257/306; 257/308; 257/532
[58] Field of Search ............. 257/306, 308, 296, 313, 257/532

[56] References Cited

U.S. PATENT DOCUMENTS

| | | | |
|---|---|---|---|
| 4,868,639 | 9/1989 | Mugiya et al. | 357/74 |
| 4,890,199 | 12/1989 | Beutler | 361/424 |
| 4,989,056 | 1/1991 | Hiraiwa et al. | 257/306 |
| 5,101,251 | 3/1992 | Wakamiya et al. | 257/306 |

FOREIGN PATENT DOCUMENTS

| | | | |
|---|---|---|---|
| 0177943 | 4/1986 | European Pat. Off. | 361/424 |
| 2618629 | 1/1989 | France | 361/424 |

*Primary Examiner*—Jerome Jackson
*Assistant Examiner*—Donald L. Monin, Jr.
*Attorney, Agent, or Firm*—Hill, Steadman & Simpson

[57] ABSTRACT

A semiconductor DRAM cell capacitor comprises an accumulation electrode (3) formed of a p-type semiconductor, and a capacitor insulating film (5) formed between the accumulation electrode (3) and the counter electrode (4). The potential of the counter electrode (4) is fixed at a ground potential. The semiconductor DRAM cell capacitor reduces the size of an associated chip and reduces the power consumption of the associated DRAM.

2 Claims, 3 Drawing Sheets

"0" STORING OPERATION

"1" STORING OPERATION

"0" STORING OPERATION

"1" STORING OPERATION

DRAM CELL CAPACITOR

This is a continuation of application Ser. No. 07/880,553, filed May 8, 1992 now abandoned.

BACKGROUND OF THE INVENTION

1. Field of the Invention

The present invention relates to a DRAM cell capacitor and, more particularly, to a highly reliable DRAM cell capacitor for a semiconductor storage device.

2. Description of the Prior Art

As shown in FIGS. 4(a) and 4(b), a DRAM (dynamic random access memory) used as a semiconductor storage device has a capacitor has an accumulation electrode and a counter electrode (cell plate) formed opposite to each other with a capacitor insulating film therebetween, and the accumulation electrode and the counter electrode are formed of a material, such as n-type silicon. Since no inner potential is produced between the accumulation electrode and the counter electrodes formed of the same n-type semiconductor, a voltage applied across the accumulation electrode and the counter electrode is applied directly to the capacitor insulating film between the electrodes. Since the counter electrode, in general, is grounded, 0 V is applied to the capacitor insulating film in storing "0" as shown in FIG. 4(a) and 2.0 V is applied to the capacitor insulating film in storing "1" as shown in FIG. 4(b) when the supply voltage is 2.0 V. Accordingly, a relatively high maximum voltage is applied to the capacitor insulating film, which causes a problem in the reliability of the DRAM cell capacitor employing a very thin capacitor insulating film to secure capacity. In a DRAM cell capacitor proposed to solve such a problem fixes the potential of the counter electrode at $\frac{1}{2} V_{cc}$, i.e., 1.0 V, instead of grounding the counter electrode. In this DRAM cell capacitor, $-1.0$ V is applied to the capacitor insulating film in storing "0" and $+1.0$ V is applied to the same in storing "1" so that the absolute value of the maximum voltage is 1.0 V.

However, it is difficult to form a circuit for stably maintaining the potential of the counter electrode at $\frac{1}{2} V_{cc}$, (1.0 V) and hence the potential of the counter electrode (cell plate) is unstable. Moreover, an increased area for circuits for the generation of $\frac{1}{2} V_{cc}$ is required and power consumption increases.

SUMMARY OF THE INVENTION

Accordingly, it is an object of the present invention to provide a DRAM cell capacitor capable of maintaining the counter electrode at stable potential of reducing circuit area (chip size) and power consumption.

The present invention provides a semiconductor DRAM comprising capacitors each comprising an accumulation electrode and a counter electrode formed opposite to the accumulation electrode, wherein the accumulation electrode is formed of a p-type semiconductor, the counter electrode is formed of an n-type semiconductor, and the potential of the counter electrode is fixed at the supply voltage.

In the DRAM capacitor in accordance with the present invention, the capacitor comprises the p-type accumulation electrode, the n-type counter electrode and a capacitor insulating film, and the potential of the n-type counter electrode is fixed at a ground potential of 0 V. Accordingly, when the supply voltage is 2.0 V, the inner potential of the capacitor insulating film is $-1.0$ V in storing and the inner potential of the capacitor capacitor insulating "0" film is 1.0 V in storing "1", the effect of which is similar to an effect acquired by applying $\frac{1}{2} V_{cc}$, and hence a low voltage is applied to the capacitor insulating film. The capacitor may comprise an n-type accumulation electrode, a p-type counter electrode and a capacitor insulating film formed between the n-type accumulation electrode and the counter electrode, and the potential of the p-type counter electrode may be fixed at the supply voltage $V_{cc}$ for the same effect.

Preferably, the p-type semiconductor is polycrystalline silicon doped with boron (B), and the n-type semiconductor is polycrystalline silicon doped with phosphorus (P) or arcenic (As).

BRIEF DESCRIPTION OF THE DRAWINGS

The above and other objects, features and advantages of the present invention will become more apparent from the following description taken in connection with the accompanying drawings, in which.

DESCRIPTION OF THE PREFERRED EMBODIMENTS

Figure 1:
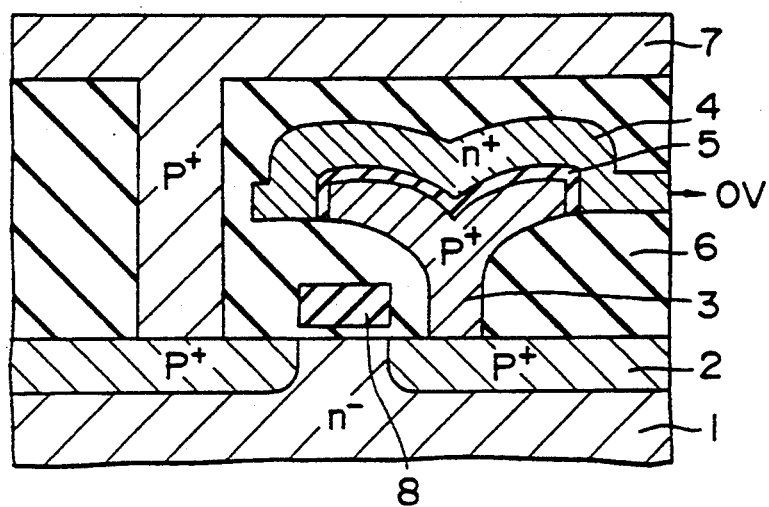
FIG. 1 is a schematic sectional view of a DRAM cell capacitor in a first embodiment according to the present invention.

Referring to FIG. 1, a DRAM cell capacitor in a first embodiment according to the present invention comprises an accumulation electrode 3 formed of a p-type semiconductor produced by doping polycrystalline silicon with boron, a counter electrode 4 formed of an n-type semiconductor produced by doping polycrystalline silicon with phosphorus, and a capacitor insulating film 5 formed of silicon nitride (Si$_3$N$_4$) between the p-type accumulation electrode 3 and the n-type counter electrode 4. The potential of the n-type counter electrode 4 is fixed at a ground potential of 0 V.

Also shown in FIG. 1 are an n-type silicon substrate 1, a p-type diffused layer 2, an insulating film 6, a bit-select line 7 formed of conductive polycrystalline silicon and a word-select line 8 formed of conductive polycrystalline silicon. The n-type silicon substrate 1, the p-type diffused layer 2 and the word-select line 8 form a PMOS transistor. The PMOS transistor and the DRAM cell capacitor form a DRAM.

Figure 2:
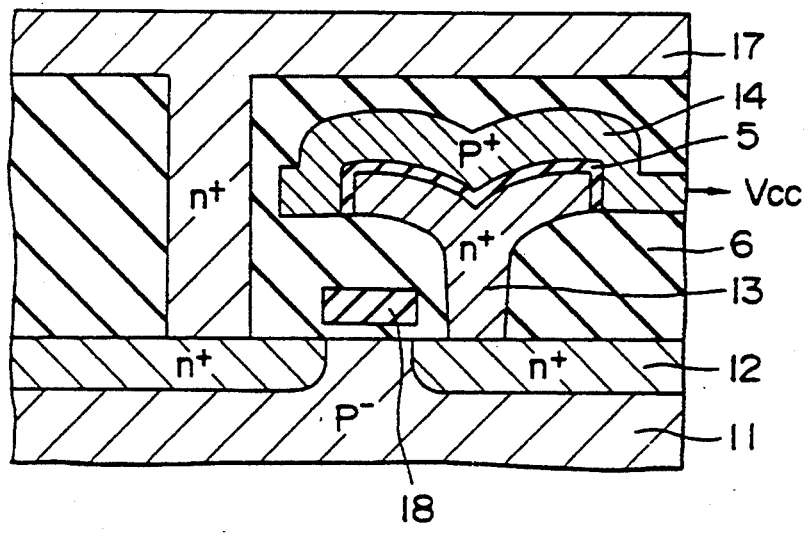
FIG. 2 is a schematic sectional view of a DRAM cell capacitor in a second embodiment according to the present invention.

Referring to FIG. 2, a DRAM cell capacitor in a second embodiment according to the present invention comprises an accumulation electrode 13 formed of an n-type semiconductor, a counter electrode 14 formed of a p-type semiconductor and an capacitor insulating film 5 formed of Si$_3$N$_4$. The potential of the p-type counter electrode 14 is fixed at a supply voltage $V_{cc}$.

Also shown in FIG. 2 are a p-type silicon substrate 11, an n-type diffused layer 12, a bit-select line 17 formed of n-type polycrystalline silicon and a word-select line 18.

Figure 3A:
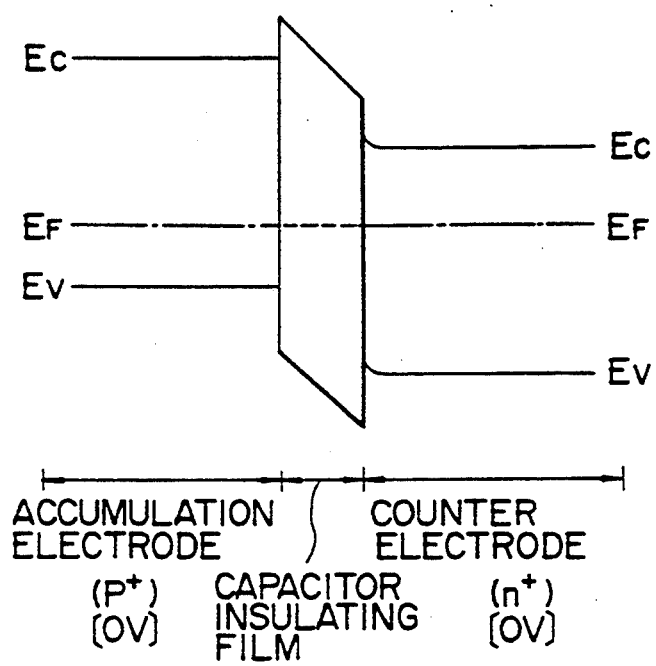
FIGS. 3(a) and 3(b) are energy band diagrams of the DRAM cell capacitor of FIG. 1.
Figure 3B:
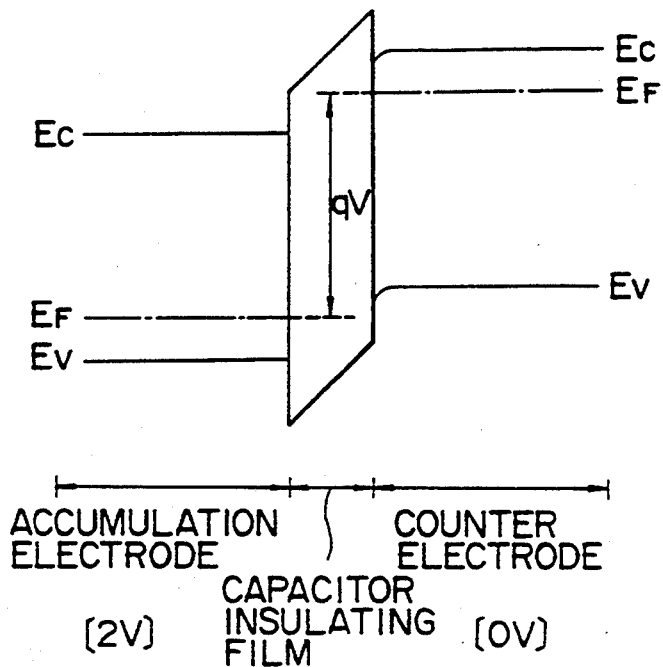
Figure 4A:
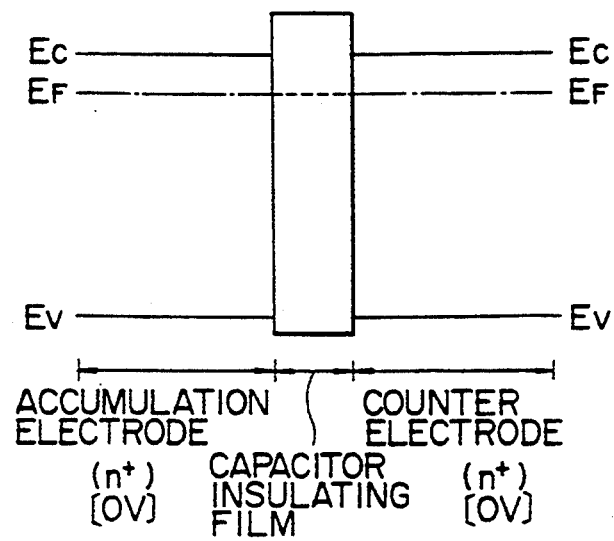
FIGS. 4(a) and 4(b) are energy band diagrams of assistance in explaining a conventional DRAM cell capacitor.
Figure 4B:
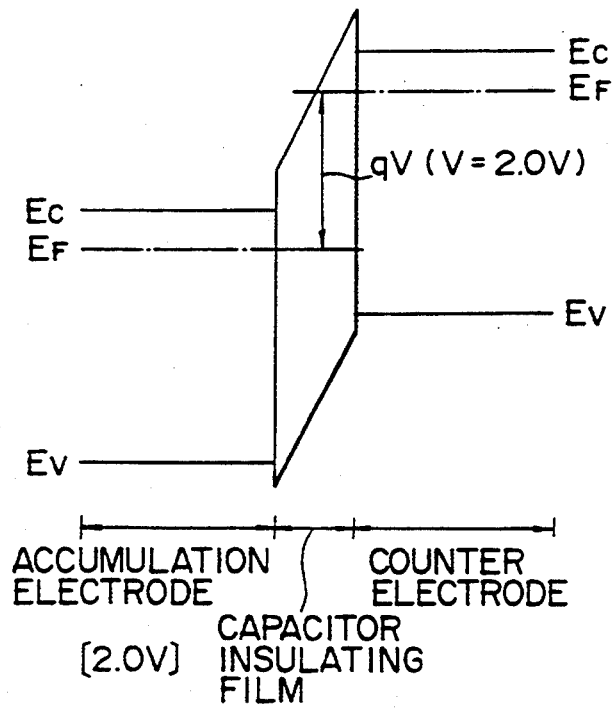

In FIGS. 3(a) and 3(b), $E_V$, $E_F$ and $E_C$ indicate valence band level, Fermi level and conduction band level, respectively.

When 0 V is applied to both the accumulation electrode 3 and the counter electrode 4 to store "0", the inner potential of the capacitor insulating film 5 is about −1.0 V as shown in FIG. 3(a). If supply voltage is 2.0 V, the potential of the accumulation electrode 3 is 2.0 V and the potential of the counter electrode 4 is 0 V in storing "1", and the inner potential of the capacitor insulating film 5 is approximately 1.0 V (2.0 - 1.0).

The same effect can be acquired by the DRAM cell capacitor in the second embodiment shown in FIG. 2.

Although the invention has been described in its preferred embodiments with a certain degree of particularity, obviously many changes and variations are possible therein. It is therefore to be understood that the present invention may be practiced otherwise than as specifically described herein without departing from the spirit and scope thereof.

What is claimed is:

1. A semiconductor DRAM cell capacitor, comprising:
    a substrate;
    a counter electrode having a top, a bottom, and first and second sides;
    an accumulation electrode having a top, a bottom, and first and second sides, said accumulation electrode directly in contact with said diffused layer in said substrate;
    a capacitor insulating film of a single layer of an insulating material formed between said bottom of said counter electrode and said top of said accumulation electrode;
    a diffusion layer in said substrate arranged in direct contact with said bottom of said accumulation electrode;
    a word select line above said substrate at a gap in said diffusion layer; and
    an insulating film surrounding said top and said first and second sides of said counter electrode and first and second ends of said capacitor insulating film and said first and second sides of said accumulation electrode,
    said accumulation electrode being of a p-type semiconductor of a first predetermined doping concentration, said first predetermined doping concentration being such that a Fermi level of said accumulation electrode lies between a conductance level and a valence level of said accumulation electrode;
    a bit select line of a p-type semiconductor extending over said counter electrode;
    said counter electrode being of an n-type semiconductor of a second predetermined doping concentration, said second predetermined doping concentration being such that a Fermi level of said counter electrode lies between a conductance level and a valence level of said counter electrode, said counter electrode extending over said word select line to block noise from said bit line from reaching said word select line; and
    a potential of said counter electrode being fixed at a ground potential.

2. A semiconductor DRAM cell capacitor, comprising:
    a substrate;
    a counter electrode having a top, a bottom, and first and second sides;
    an accumulation electrode having a top, a bottom, and first and second sides, said accumulation electrode being in direct contact with said diffused layer in said substrate;
    a capacitor insulating film of a single layer of an insulating material formed between said bottom of said counter electrode and said top of said accumulation electrode;
    a diffusion layer in said substrate arranged in direct contact with said bottom of said accumulation electrode;
    a word select line over said substrate at a gap in said diffusion layer; and
    an insulating film surrounding said top and said first and second sides of said counter electrode and first and second ends of said capacitor insulating film and said first and second sides of said accumulation electrode,
    said accumulation electrode being of an n-type semiconductor of a first predetermined doping concentration, said first predetermined doping concentration being such that a Fermi level of said accumulation electrode lies between a conductance level and a valence level of said accumulation electrode;
    a bit select line of an n-type semiconductor material extending over said counter electrode;
    said counter electrode being of a p-type semiconductor of a second predetermined doping concentration, said second predetermined doping concentration being such that a Fermi level of said counter electrode lies between a conductance level and a valence level of said counter electrode, said counter electrode extending over said word select line to block noise from said bit line from reaching said word select line; and
    a potential of said counter electrode being fixed at a supply voltage.

* * * * *